United States Patent
Bonifield et al.

(10) Patent No.: US 11,784,212 B2
(45) Date of Patent: Oct. 10, 2023

(54) STANDALONE HIGH VOLTAGE GALVANIC ISOLATION CAPACITORS

(71) Applicant: Texas Instruments Incorporated, Dallas, TX (US)

(72) Inventors: Thomas Dyer Bonifield, Dallas, TX (US); Jeffrey Alan West, Dallas, TX (US); Byron Lovell Williams, Plano, TX (US); Elizabeth Costner Stewart, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/007,726

(22) Filed: Aug. 31, 2020

(65) Prior Publication Data
US 2022/0069066 A1    Mar. 3, 2022

(51) Int. Cl.
*H01L 23/522* (2006.01)
*H01L 27/02* (2006.01)
*H01L 49/02* (2006.01)

(52) U.S. Cl.
CPC .......... *H01L 28/60* (2013.01); *H01L 23/5223* (2013.01); *H01L 27/0292* (2013.01)

(58) Field of Classification Search
CPC ... H01L 28/82–92; H01L 29/93; H01L 28/60; H01L 27/0292; H01L 23/5223; H01L 29/94
USPC .......... 257/303–306, 311, 312, 532; 438/393–396
See application file for complete search history.

(56) References Cited

U.S. PATENT DOCUMENTS

| | | | |
|---|---|---|---|
| 7,060,553 B2 * | 6/2006 | Fried | H01L 28/90 438/239 |
| 9,875,846 B2 * | 1/2018 | Guo | H01G 4/18 |
| 10,366,958 B2 * | 7/2019 | Bonifield | H01L 25/0655 |
| 10,644,099 B1 * | 5/2020 | Seidel | H01L 28/75 |
| 11,049,820 B2 * | 6/2021 | Stewart | H01L 23/5223 |
| 2013/0270675 A1 * | 10/2013 | Childs | H01L 23/5223 257/532 |
| 2019/0081133 A1 | 3/2019 | Cook et al. | |
| 2020/0013713 A1 | 1/2020 | West et al. | |
| 2020/0168534 A1 | 5/2020 | Bonifield et al. | |
| 2020/0211961 A1 | 7/2020 | Khanolkar | |

OTHER PUBLICATIONS

PCT Search Report, dated Nov. 18, 2021.

* cited by examiner

*Primary Examiner* — Monica D Harrison
(74) *Attorney, Agent, or Firm* — Andrew R. Ralston; Frank D. Cimino

(57) ABSTRACT

A galvanic isolation capacitor device includes a semiconductor substrate and a PMD layer over the semiconductor substrate. The PMD layer has a first thickness. A lower metal plate is over the PMD layer and an ILD layer is on the lower metal plate; the ILD layer has a second thickness. A ratio of the first thickness to the second thickness is between about 1 and 1.55 inclusive. A first upper metal plate over the ILD layer has a first area and a second upper metal plate over the ILD layer has a second area; a ratio of the first area to the second area is greater than about 5. The galvanic isolation capacitor device can be part of a multi-chip module.

24 Claims, 13 Drawing Sheets

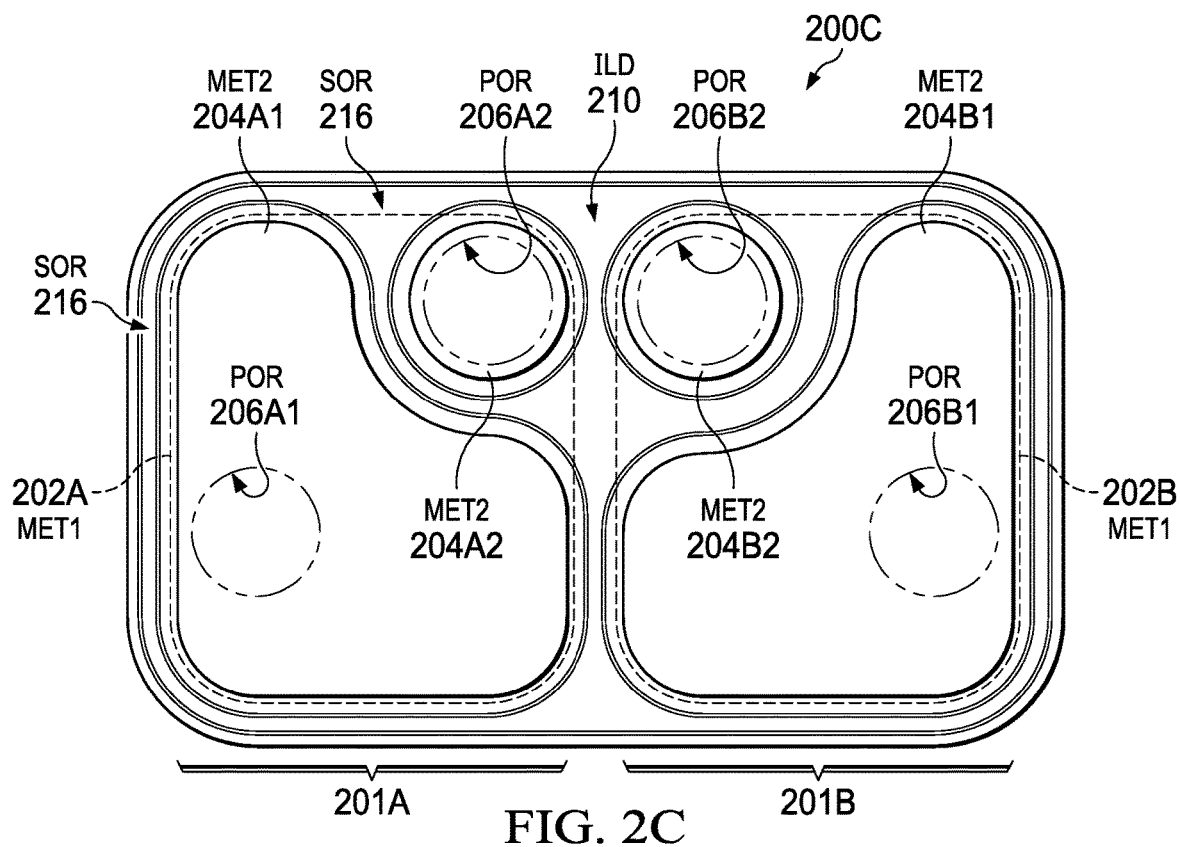
FIG. 2C
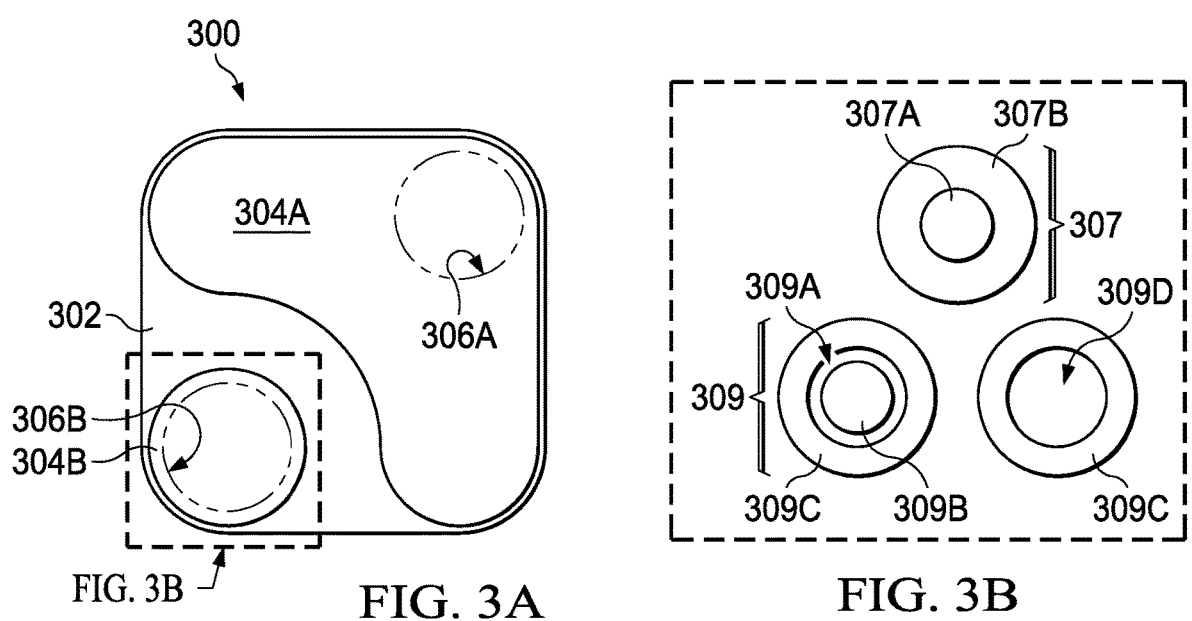
FIG. 3A
FIG. 3B

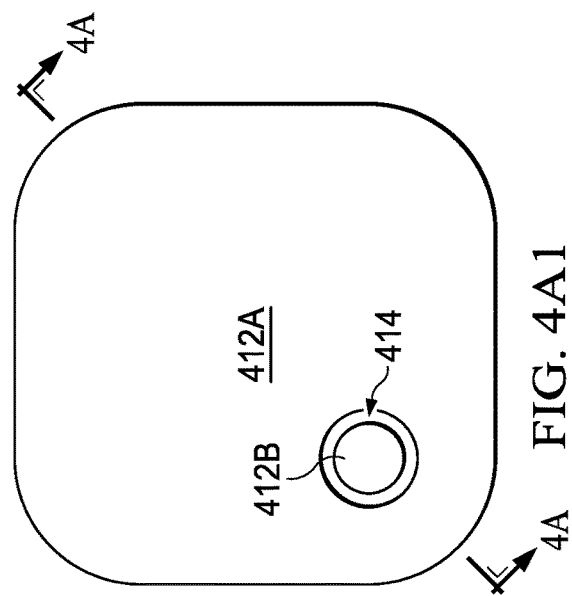
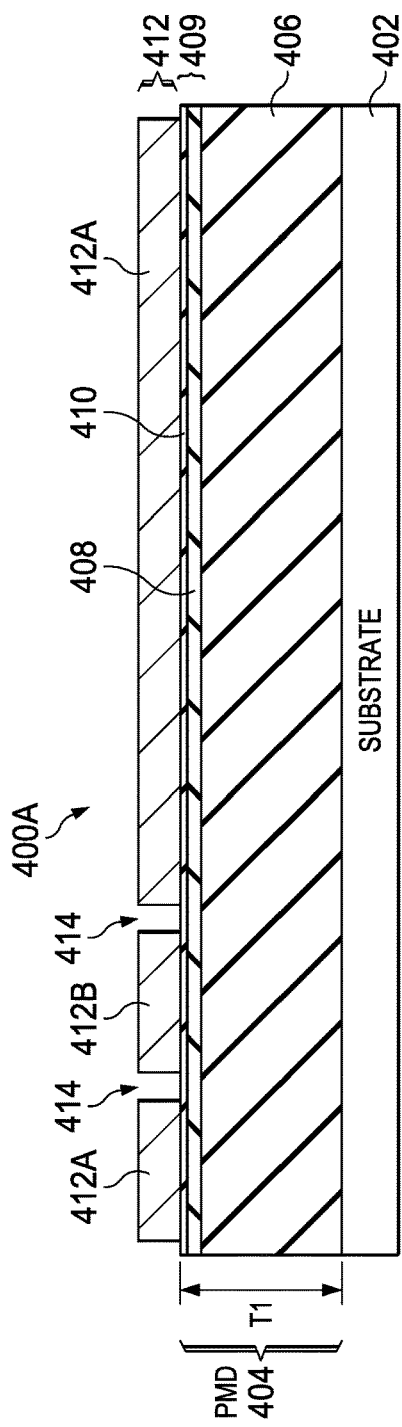

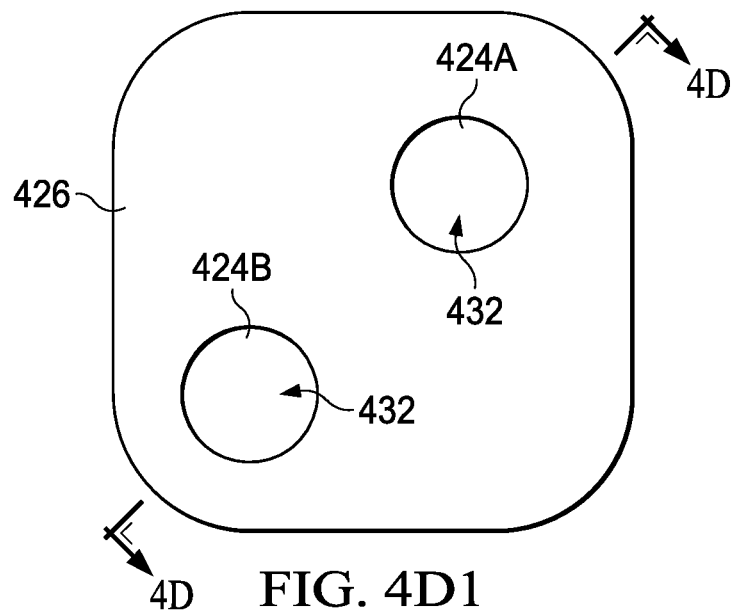
FIG. 4D1
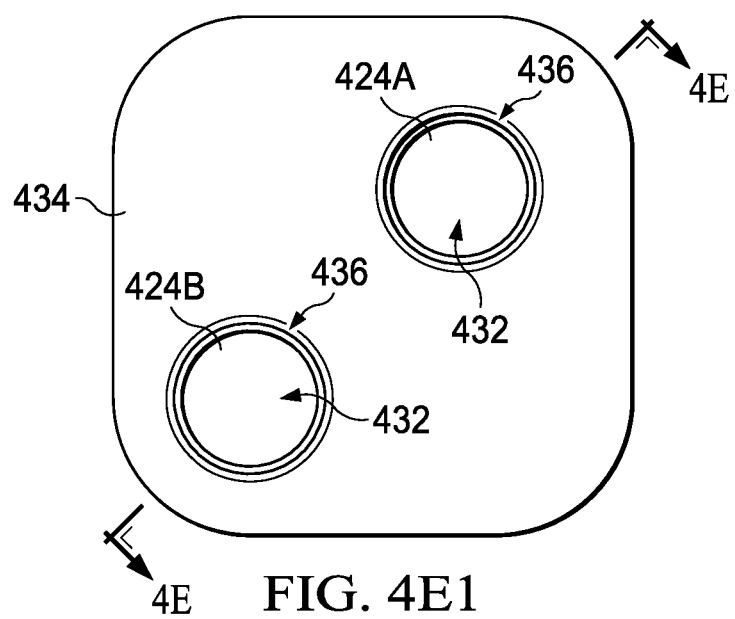
FIG. 4E1

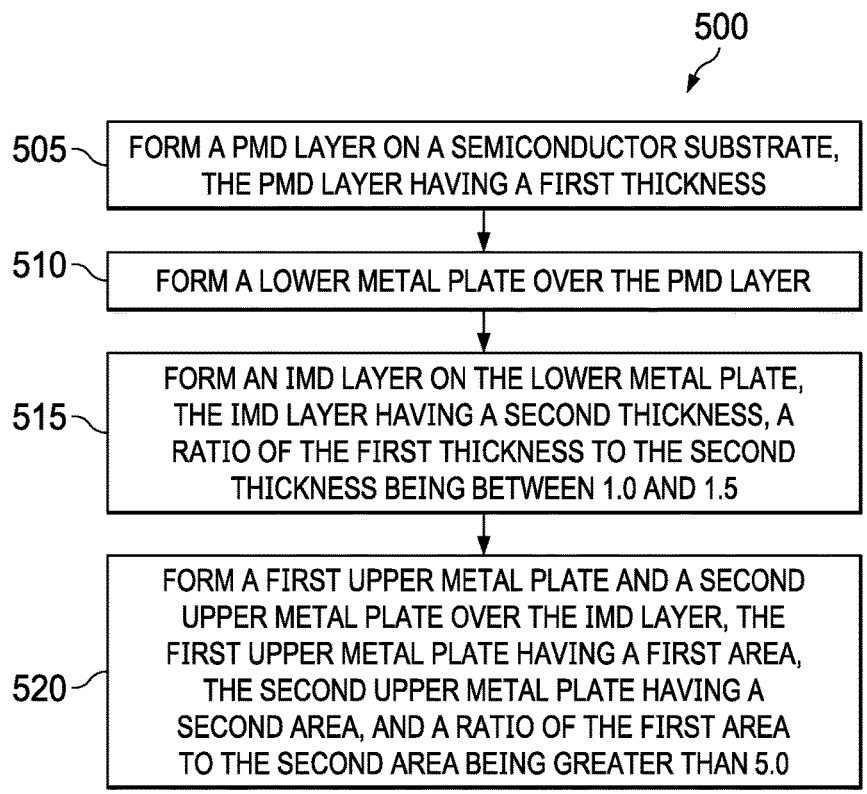
FIG. 5
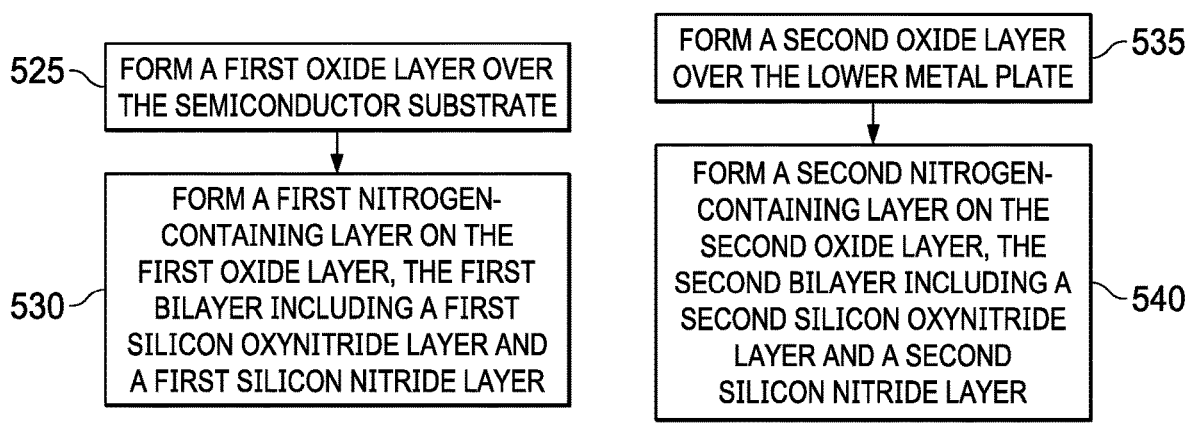
FIG. 5A
FIG. 5B

FORM AN ISOLATION TRENCH THROUGH THE SECOND NITROGEN-CONTAINING LAYER, THE ISOLATION TRENCH SURROUNDING THE FIRST UPPER METAL PLATE AND THE SECOND UPPER METAL PLATE —545

FIG. 5C

550— FORM A DIELECTRIC OVERCOAT LAYER ON THE FIRST UPPER METAL PLATE, THE SECOND UPPER METAL PLATE, AND A PORTION OF THE ILD LAYER

555— FORM A FIRST CONTACT OPENING AND A SECOND CONTACT OPENING THROUGH THE DIELECTRIC OVERCOAT LAYER. THE FIRST CONTACT OPENING IS OVER THE FIRST UPPER METAL PLATE AND THE SECOND CONTACT OPENING IS OVER THE SECOND UPPER METAL PLATE

FIG. 5D

FORM A POLYIMIDE LAYER ON THE DIELECTRIC OVERCOAT LAYER —560

FORM A FIRST ACCESS OPENING AND A SECOND ACCESS OPENING THROUGH THE POLYIMIDE LAYER. THE FIRST ACCESS OPENING IS OVER THE FIRST CONTACT OPENING AND THE SECOND ACCESS OPENING IS OVER THE SECOND CONTACT OPENING —565

FIG. 5E

570 — FORM A CAPACITANCE-REDUCING OPENING THROUGH THE LOWER METAL PLATE, THE CAPACITANCE-REDUCING OPENING LOCATED UNDER THE SECOND UPPER METAL PLATE

FIG. 5F

575 — FORM A CIRCULAR TRENCH THAT ISOLATES A PORTION OF THE LOWER METAL PLATE FROM A REMAINDER OF THE LOWER METAL PLATE

FIG. 5G

580 — FORM A CIRCULAR OPENING THROUGH THE LOWER METAL PLATE

FIG. 5H

585 — PATTERN A FIRST ALUMINUM LAYER USING SUBTRACTIVE ETCHING

590 — PATTERN A SECOND ALUMINUM LAYER USING SUBTRACTIVE ETCHING

FIG. 5I

STANDALONE HIGH VOLTAGE GALVANIC ISOLATION CAPACITORS

FIELD OF THE DISCLOSURE

Disclosed implementations relate generally to the field of semiconductor devices, and more particularly, but not exclusively, to standalone high voltage galvanic isolation capacitors.

BACKGROUND

Previous galvanic isolation capacitor devices have typically been integrated as components embedded within separate integrated circuits built on silicon wafers. To achieve reinforced isolation capability, these capacitors are typically of equal area and paired in series between two die within a multi-chip module (MCM), one die with its silicon substrate at a low potential and another die with its silicon substrate at a high potential so that each capacitor sees only one-half of the total voltage difference across the MCM. Previously, standalone galvanic isolation used polyimide/gold/polyimide/gold/polyimide transformers. These galvanic isolation transformer devices are large in area, high cost, and have lower isolation working voltages than silicon-based capacitors.

SUMMARY

Disclosed implementations provide low cost standalone galvanic isolation capacitors that can be integrated into multi-chip modules to reduce costs compared to the use of embedded capacitors. Series capacitors are provided on a common substrate, with the lower plates tied together and left electrically floating. Fabrication of the standalone galvanic isolation capacitors uses a simple process flow that includes only dielectric/metal/dielectric/metal to create a high voltage isolation component.

When a chip containing the standalone galvanic isolation capacitors is used in an MCM, in which the standalone galvanic isolation capacitors are placed on a die attach pad (DAP) with a high-voltage device, the two capacitors forming the galvanic isolation series capacitor pair are fabricated with asymmetric areas. In one implementation the ratio of the area of a first capacitor to the area of a second capacitor is between about 5 and about 10. A thickness ratio of a pre-metal dielectric (PMD) layer, which is between the substrate and the bottom capacitor plate, to an interlayer dielectric (ILD) layer, which between the bottom and top capacitor plates, can also be optimized to a value between about 1 and about 1.55 to balance the electric fields between the high-voltage capacitor and the low-voltage capacitor. While such implementations may be expected to improve the capabilities of such standalone galvanic isolation capacitors in terms of size, working voltages and wafer costs, no particular result is a requirement of the described invention(s) unless explicitly recited in a particular claim.

In one aspect, an implementation of a galvanic isolation capacitor device is disclosed. The galvanic isolation capacitor device includes a PMD layer having a first thickness located over a semiconductor substrate. A lower metal plate is located over the PMD layer, and an inter-level dielectric (ILD) layer is located over the lower metal plate. The ILD layer has a second thickness; a ratio of the first thickness to the second thickness is between about 1 and about 1.55 inclusive. A first upper metal plate having a first area and a second upper metal plate having a second area are located over the ILD layer. A ratio of the first area to the second area is greater than about 5 and less than about 10.

In another aspect, an implementation of a multi-chip module is disclosed. The multi-chip module includes a first die having a first integrated circuit configured to operate at a first voltage level and a second die having a second integrated circuit configured to operate at a second voltage level; a difference between the first voltage level and the second voltage level is greater than about 500 V. The multi-chip module further includes a third die containing a first capacitor coupled in series with a second capacitor through a bottom metal plate. The first capacitor includes a first upper metal plate having a first area, the first upper metal plate being coupled to the first integrated circuit. The second capacitor includes a second upper metal plate having a second area, the second upper metal plate being coupled to the second integrated circuit. A ratio of the first area to the second area is 5.0 or greater.

In yet another aspect, an implementation of a process of forming an integrated circuit is disclosed. The process includes forming a PMD layer over a semiconductor substrate, the PMD layer having a first thickness, and forming a lower metal plate over the PMD layer. An ILD layer is formed over the lower metal plate, the ILD layer having a second thickness. A ratio of the first thickness to the second thickness is between about 1.0 and about 1.55. A first upper metal plate and a second upper metal plate are formed over the ILD layer, the first upper metal plate having a first area and the second upper metal plate having a second area; a ratio of the first area to the second area is greater than 5.0.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections. The accompanying drawings are not necessarily drawn to scale and except where relationships between portions of the drawings are explicitly stated, no comparisons of sizes should be inferred from the drawings.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

FIG. 2C depicts a chip containing two sets of galvanic isolation capacitors according to an implementation of the disclosure;

FIG. 3A illustrates a top-down view of certain elements of an IC chip containing standalone high-voltage galvanic isolation capacitors according to an implementation of the disclosure;

FIG. 3B depicts modifications to the effective capacitor size of the second capacitor of FIG. 3A according to an implementation of the disclosure;

FIGS. 4A through 4E depict a cross-section of the IC chip of FIG. 3A at various stages in the process of forming the IC chip according to an implementation of the disclosure;

FIGS. 4A1 through 4E1 depict a top-down view of the IC chip corresponding to respective stages in the process of forming the IC chip according to an implementation of the disclosure;

FIG. 5 depicts a flowchart of a process of forming an integrated circuit according to an implementation of the disclosure;

FIG. 5A through FIG. 5I each provide additional elements that may be part of the process of FIG. 5;

DETAILED DESCRIPTION OF THE DRAWINGS

Specific implementations of the invention will now be described in detail with reference to the accompanying figures. In the following detailed description of implementations of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 6A:
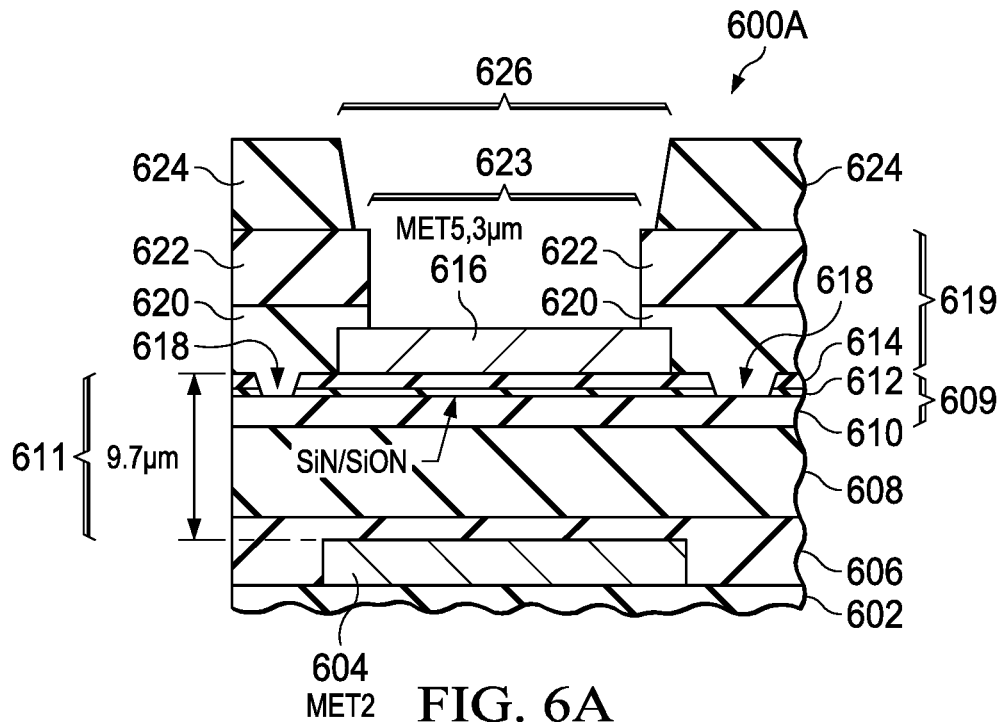
FIG. 6A depicts a cross-section of a baseline isolation capacitor.

FIG. 6A depicts a cross-section of a baseline isolation capacitor 600A that can be integrated into an IC chip containing additional circuitry (not specifically shown). The additional circuitry can include, e.g., transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors; diodes; capacitors; inductors; and other suitable elements. Once the additional circuitry has been formed, a PMD (not specifically shown), which in one example may include silicon oxide, is formed on the IC chip and a first metallization layer (also not specifically shown) is formed on the PMD. A first ILD layer 602, which in one example is silicon oxide, is formed on the first metallization layer and a second metallization layer is formed on the first ILD layer 602. In baseline isolation capacitor 600A, the second metallization layer includes a lower metal plate 604.

A second ILD layer 606, a third ILD layer 608, and a fourth ILD layer 609 are each formed in succession. In one implementation, each of the second ILD layer 606, the third ILD layer 608, and the fourth ILD layer 609 includes silicon dioxide. In the implementation shown, fourth ILD layer 609 has multiple layers that include silicon dioxide layer 610, silicon oxynitride layer 612, and silicon nitride layer 614. A fifth metal layer, which includes an upper metal plate 616, is formed on fourth ILD layer 609. In the implementation shown, the capacitor ILD 611 that is located between the lower metal plate 604 and the upper metal plate 616 is about 9.7 μm.

An isolation trench 618 has been formed through the silicon nitride layer 614 and the silicon oxynitride layer 612. The isolation trench 618 surrounds the upper metal plate 616 and protects against leakage current through the interface of silicon oxynitride layer 612 and silicon nitride layer 614; the maximum working voltage of the baseline isolation capacitor 600 is improved by reducing or eliminating this lateral breakdown fail mode. A protective overcoat 619 includes a silicon dioxide layer 620 and a silicon oxynitride layer 622, on which is formed a polyimide layer 624.

In one example, the protective overcoat 619 is formed on the fifth metallization layer that includes the upper metal plate 616, followed by patterning and etching of the protective overcoat 619 to form contact openings 623. The polyimide layer 624 is then formed over the protective overcoat 619, followed by exposing, developing and curing to create openings 626 over the contact openings 623 to expose at least some portions of the upper metal plate 616.

Figure 6B:
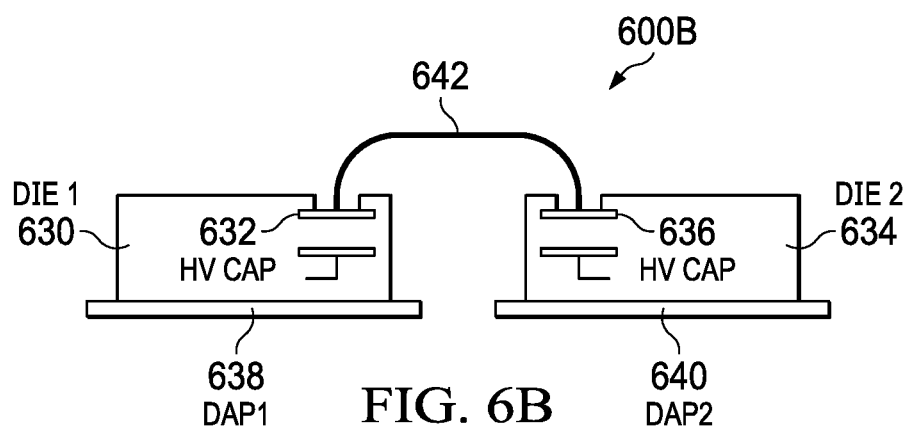
FIG. 6B depicts the baseline isolation capacitor of FIG. 6A as utilized in a multi-chip module.

FIG. 6B depicts a multi-chip module (MCM) 600B in which the baseline isolation capacitor 600 can be used. A first die 630 in MCM 600B includes a first high-voltage capacitor 632 and a second die 634 includes a second high-voltage capacitor 636. The first die 630 is mounted on a first die attach pad (DAP) 638 and operates at a first voltage; the second die 634 is mounted on a second DAP 640 and operates at a second voltage. The potential difference between the first voltage and the second voltage can be greater than 500 volts, and may be, e.g., 1000-1500 V. In one implementation, the first high-voltage capacitor 632 has a lower metal plate that is coupled to a circuit (not specifically shown) that operates at a working voltage of 1000 V and the second high-voltage capacitor 636 has a lower metal plate that is coupled to a circuit (not specifically shown) that operates at a working voltage of about 5 V. The first high-voltage capacitor 632 and the second high-voltage capacitor 636 are connected in series through an inter-die connection 642, which bonds the upper metal plate of the first high-voltage capacitor 632 to the upper metal plate of the second high-voltage capacitor 636 and allows communication to occur between the two die.

Figure 1:
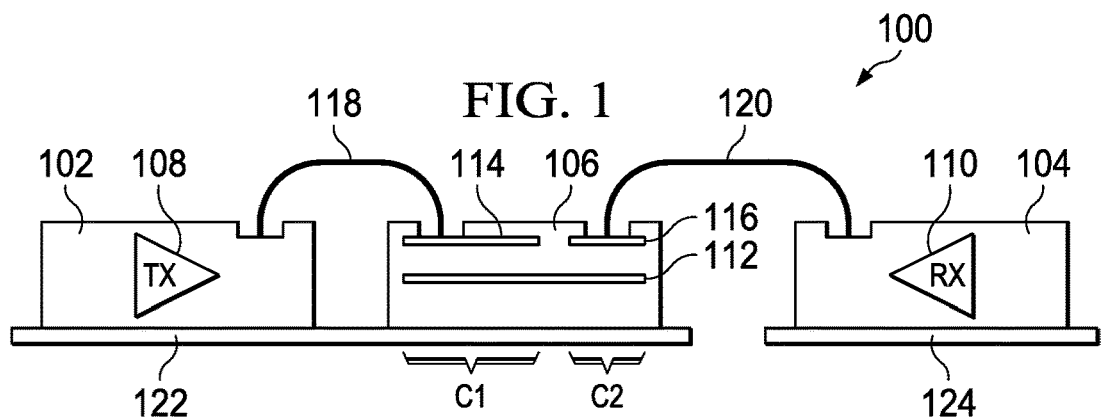
FIG. 1 depicts a multi-chip module that can utilize a standalone galvanic isolation capacitor device according to an implementation of the disclosure.

FIG. 1 depicts a multi-chip module (MCM) 100 that includes a first die 102, a second die 104, and a third die 106. The first die 102 contains a first integrated circuit 108, which is represented in MCM 100 by a transmitter. The first integrated circuit 108 operates at a first voltage level that is high-voltage, e.g., greater than 500 V. The second die 104 contains a second integrated circuit 110, which is represented in MCM 100 by a receiver. The second integrated circuit 110 operates at a second voltage level that is low-voltage, e.g., about 5 V or less. The third die 106 is a standalone galvanic isolation capacitor device and contains a first capacitor C1 and a second capacitor C2, which share a lower metal plate 112. The first capacitor C1 has a first upper metal plate 114 and the second capacitor C2 has a second upper metal plate 116. The first die 102 is coupled to the first upper metal plate 114 through a first inter-die connector 118 and the second die 104 is coupled to the second upper metal plate 116 through a second inter-die connector 120. In the MCM 100, the first die 102 and the third die 106 are mounted to a first die attach pad (DAP) 122 and the second die 104 is mounted to a second DAP 124.

U.S. Patent Application Publication No. 2020/0168534-A1 (hereinafter the '534 application), published May 28, 2020, which is commonly owned with the present application and which is hereby incorporated by reference, discloses a standalone galvanic isolation capacitor device that can be used in an MCM. The '534 application discloses that in the implementation shown in MCM 100, due to capacitive coupling with the high voltage first DAP 122, the lower metal plate 112 does not float to the mid-point voltage between the first DAP 122 and the second DAP 124. Further, if the first capacitor C1 and the second capacitor C2 are built with symmetric areas, the capacitive coupling generates asymmetric electric fields between the first capacitor C1 and the second capacitor C2. In this case, the first capacitor C1, which carries the highest electric field, is at a higher risk of early breakdown failure. This led to the disclosure that in some instances, standalone galvanic isolation capacitors such as first capacitor C1 and second capacitor C2 need to have asymmetric areas in order to achieve symmetric capacitance. Because the asymmetric areas can be necessary, further study of an optimal area ratio was performed.

Figure 1A:
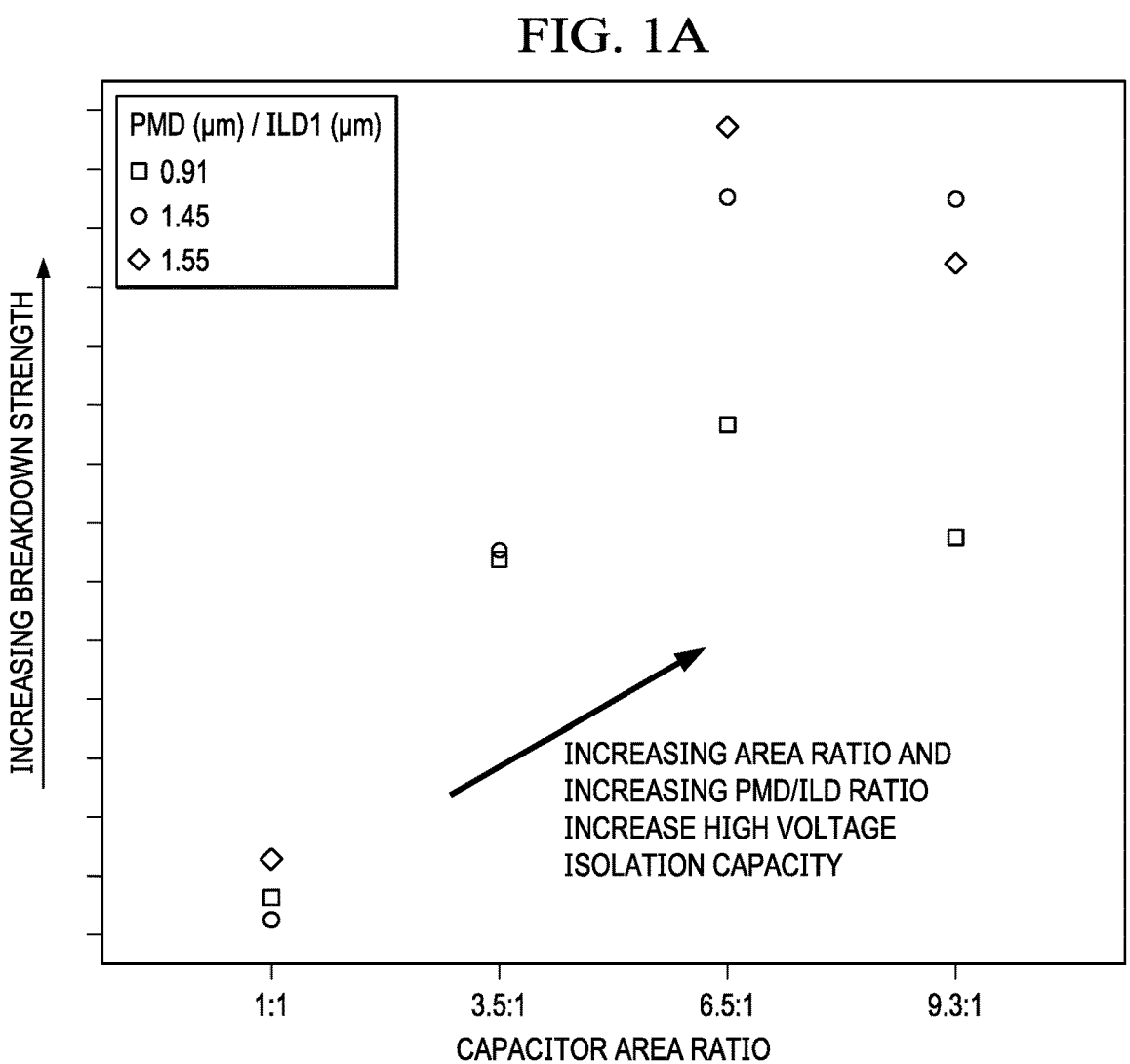
FIG. 1A provides a graph that depicts ramp-to-breakdown (RTB) testing of standalone galvanic isolation capacitor devices having different capacitance area ratios and PMD/ILD ratios.

FIG. 1A provides a graph that depicts results of ramp-to-breakdown (RTB) testing of different implementations of standalone galvanic isolation capacitor devices that have a number of different capacitor area ratios between the first capacitor C1 and the second capacitor C2, e.g., ratios of 1, 3.6, 6.5, and 9.3. Additionally, because the lower metal plate 112 of the capacitors is electrically floating in third die 106, breakdown between the lower metal plate 112 and the substrate (not specifically shown) can limit high voltage performance. Therefore, three different thicknesses of the pre-metal dielectric were tested to determine an optimum combination of the capacitor ratio and the PMD/ILD thickness ratio, with testing performed at PMD/ILD ratios of 0.91, 1.45, and 1.55. The experimental data shows that increasing breakdown strength can be achieved by co-optimization of the PMD/ILD thickness ratio and capacitor area ratio. When the ILD thickness is greater than the PMD thickness, strong isolation capability cannot be obtained since an early breakdown fail mode between the bottom plate and substrate will dominate. In addition to adjusting the asymmetric capacitor area ratio, it may be advantageous that the PMD have a thickness greater than a thickness of the ILD in order to increase the isolation capability of the device. Based on these results, PMD/ILD ratios that are greater than 1 and capacitor area ratios that are greater than 5 provide highest isolation capability. In one embodiment, the best combination was comprised of a capacitor area ratio of 6.5 and a PMD/ILD ratio of 1.55. The PMD and ILD total thicknesses are limited by manufacturability concerns. Thick layers of dielectric increase the stress on the substrate to such an extent that the device cannot be easily processed in a typical manufacturing environment. Additionally, as the dielectric thickness increases, the dielectrics are increasingly prone to cracking. Therefore, the onset of excessive wafer bow and dielectric cracking limit the total dielectric thicknesses and thus PMD/ILD ratio that can be achieved in a typical manufacturing environment.

One example of electric field modeling of a first standalone galvanic isolation capacitor device formed with symmetric capacitors versus a second standalone galvanic isolation capacitor device formed with asymmetric capacitors is shown in Table 1 below and illustrates the E-field imbalance that asymmetric capacitors areas correct:

TABLE 1

| Case | PMD (µm) | ILD (µm) | C2 Avg. E-field (Vrms/µm @5 kVrms) | C1 Avg. E-field (Vrms/µm @5 kVrms) | C1 Avg. E-field/ C2 Avg. E-field | C1/C2 Area Ratio |
|---|---|---|---|---|---|---|
| Symmetric | 10 | 10.9 | 93.7 | 372 | 3.81 | 1 |
| Asymmetric | 15 | 10.9 | 226 | 244 | 1.08 | 9.1 |

The first standalone galvanic isolation capacitor device with symmetric capacitors has a PMD thickness below the lower metal plate of 10 µm and an ILD thickness between the upper metal plate and the lower metal plate of 10.9 µm. The average electric field for the second capacitor C2 was modeled at 93.7 Vrms/µm at 5 kVrms, while the average electric field for the first capacitor C1 was modeled at 372 Vrms/µm at 5 kVrms. This large difference in electric fields provides a ratio between the C1 average electric field and the C2 average electric field of 3.81, which is unacceptably high as it limits the high voltage capability of the standalone galvanic isolator.

In contrast, the second standalone galvanic isolation capacitor device with asymmetric capacitors has an area ratio for the first capacitor C1 to the second capacitor C2 of 9.1 and a PMD thickness below the lower metal plate of 15 µm, while the ILD thickness between the upper metal plate and the lower metal plate remained at 10.9 µm. In this implementation, the average electric field for the second capacitor C2 was at 226 Vrms/µm at 5 kVrms, while the average electric field for the first capacitor C1 was 244 Vrms/µm at 5 kVrms. The ratio between the C1 average electric field and the C2 average electric field for this asymmetric implementation was much more balanced at 1.08.

Figure 2A:
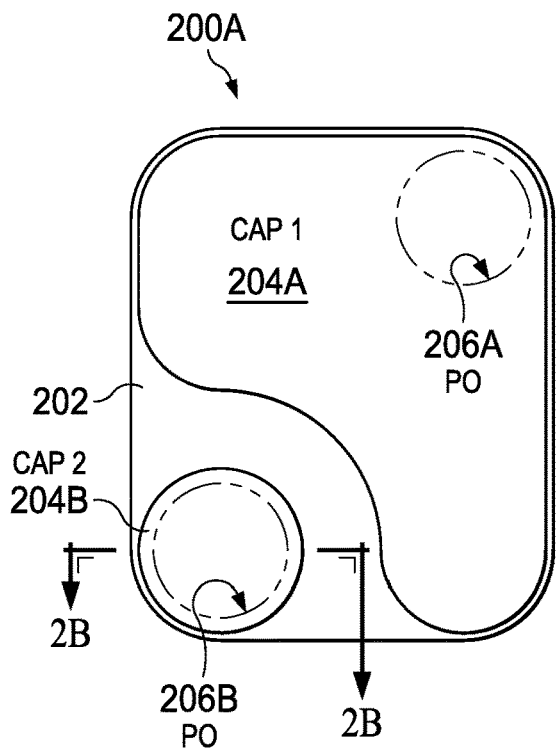
FIG. 2A illustrates a top-down view of certain elements of a chip containing standalone series-coupled high-voltage galvanic isolation capacitors according to an implementation of the disclosure.
Figure 2B:
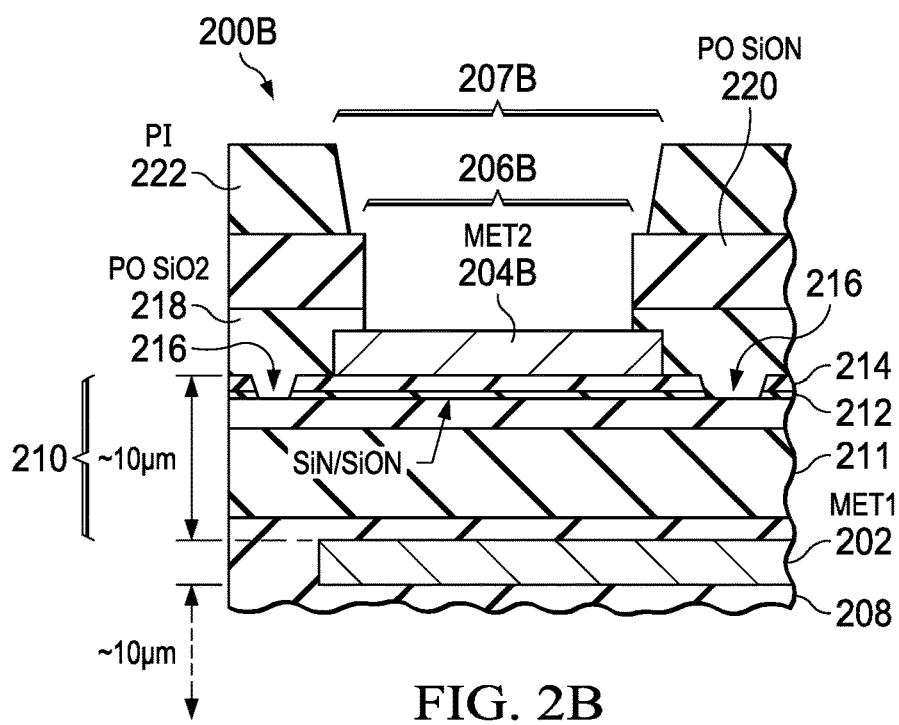
FIG. 2B depicts a cross section of the second capacitor of FIG. 2A according to an implementation of the disclosure.

FIG. 2A depicts a top down view that illustrates the metal plates that form the capacitors in an implementation of a standalone galvanic isolation device 200A and FIG. 2B depicts a cross-section 200B through a portion of the standalone galvanic isolation capacitor device as marked in FIG. 2A. Similar numbering is maintained between FIG. 2A and FIG. 2B and they are discussed together. Standalone galvanic isolation capacitor device 200 includes a lower metal plate 202, which is formed in contact with a thick PMD layer 208 (only part of which is shown in FIG. 2B). Lower metal plate 202 is shared by both the first capacitor, which is formed between a first upper metal plate 204A and the lower metal plate 202, and a second capacitor, which is formed between a second upper metal plate 204B and the lower metal plate 202. In one implementation, the first upper metal plate 204A, the second upper metal plate 204B, and the lower metal plate 202 are formed of aluminum and the area ratio between the first capacitor and the second capacitor is 5.0 or greater, e.g., 6.5.

A thick ILD layer 210 is formed on the lower metal plate 202; and the first upper metal plate 204A and the second upper metal plate 204B are formed in contact with the ILD layer 210. Both the PMD layer 208 and the ILD layer 210 can be formed of multiple layers of dielectric; the exact composition of which is not relevant to the present disclosure. In one implementation, both PMD layer 208 and ILD layer 210 are formed of multiple layers of dielectric material, which may include silicon dioxide, silicon oxynitride, and/or silicon nitride. In the implementation shown in cross-section 200B, ILD layer 210 includes one or more thick layers of silicon dioxide 211 over which a silicon oxynitride layer 212 (e.g., 100 nm to 700 nm) and a silicon nitride layer 214 (e.g., 300 nm to 1000 nm) have been formed prior to formation of the first upper metal plate 204A and the second upper metal plate 204B. After formation of the first metal plate 204A and the second metal plate 204B, an isolation trench 216 is formed around the first upper metal plate 204A and the second upper metal plate 204B. Isolation trench 216 extends through the silicon nitride layer 214 and the silicon oxynitride layer 212, but could optionally extend through the silicon nitride layer 214 and only partially through the silicon oxynitride layer 212.

A first protective overcoat layer 218 is formed on the first upper metal plate 204A, the second upper metal plate 204B, and the exposed portions of ILD layer 210. A second protective overcoat layer 220 is formed on the first protective overcoat layer 218. In one implementation, first protective overcoat layer 218 is silicon dioxide and the second protective overcoat layer 220 is silicon oxynitride. A first contact opening 206A and a second contact opening 206B are formed simultaneously to expose portions of the first metal plate 204A and the second metal plate 204B to provide contacts. The first contact opening 206A and second contact opening 206B are shown in FIG. 2A. The minimum size of the contact opening provides a lower limit on the size of the smaller, second upper metal plate 204B. Finally, a polyimide layer 222 is formed on the second protective overcoat layer 220. A first access opening (not specifically shown) and a second access opening 207B are formed in the polyimide layer 222 to expose the first contact opening 206A and the second contact opening 206B.

FIG. 2C depicts a single die 200C containing a first galvanic isolation device 201A and a second galvanic isolation device 201B and is provided largely to demonstrate the placement of an isolation trench, e.g., the isolation trench 216, through the silicon nitride/silicon oxynitride layers on the die. The first galvanic isolation device 201A includes a lower metal plate 202A, which is separated from a first upper metal plate 204A1 and a second upper metal plate 204A2 by an ILD layer (not specifically shown). A first contact opening 206A1 exposes a portion of the first upper metal plate 204A1 and a second contact opening 206A2 exposes a portion of the second upper metal plate 204A2. Similarly, the second galvanic isolation device 201B includes a lower metal plate 202B, which is separated from a first upper metal plate 204B1 and a second upper metal plate 204B2 by the ILD layer (not specifically shown). A first contact opening 206B1 exposes a portion of the first upper metal plate 204B1 and a second contact opening 206B2 exposes a portion of the second upper metal plate 204B2. Isolation trench 216, which is formed through the silicon nitride/silicon oxynitride layers (not specifically shown) on the die extends around the circumference of each of first galvanic isolation device 201A and second galvanic isolation device 201B, as well as between first upper metal plate 204A1 and second upper metal plate 204A2 and also between first upper metal plate 204B1 and second upper metal plate 204B2. In one embodiment, additional stand-alone galvanic isolation devices (not specifically shown) are formed on the die 200C.

FIG. 3A depicts a galvanic isolation device 300 that occupies a smaller area than the galvanic isolation device 200A, while providing the same area ratio. The galvanic isolation device 300 includes lower metal plate 302, first upper metal plate 304A, second upper metal plate 304B, first contact opening 306A, and second contact opening 306B. As mentioned previously, the size of the contact openings is one factor that limits the size of the galvanic isolation device. In this implementation, it was not possible to further reduce the size of contact opening 306B and thus the size of the second upper metal plate 304B. Therefore, Applicants relied on using a capacitance-reducing opening in the lower metal plate 302 to shrink the effective size of the second capacitor.

In some embodiments it is necessary to reduce both the total die area of the device and also the total capacitance of the series capacitors. The area of upper and lower metal plates should be reduced while also maintaining the necessary area ratio (>5) between the capacitors. In FIG. 3B, the area of the second capacitor represented by second upper metal plate 304B is shown as an upper metal plate 307 and two possible implementations of a lower metal plate 309. The minimum upper metal plate 307 area is limited by the size of the contact opening 306B, and the size of the contact opening 306B is determined by wirebond manufacturability requirements. In the first implementation of the lower metal plate 309 shown on the left, the capacitance-reducing opening is a trench 309A that has been etched through the lower metal plate to isolate a region 309B from the remainder of the lower metal plate 302. The region 309B is no longer connected to the lower plate 302, effectively reducing the total area of the capacitor formed by lower metal plate 309 and upper metal plate 307. A portion 307A of the upper metal plate 307 does not add to the capacitance since it is unmatched by the lower plate 309. Thus the effective size of the capacitor is shown by an upper effective region 307B and a lower effective region 309C. Similar results can be obtained when the capacitance-reducing opening is a circular opening 309D through the lower metal plate 302 that removes all of the metal within the region, leaving only the lower effective region 309C. By reducing the effective area of the smaller capacitor, the area of the larger capacitor can also be reduced while maintaining the desired area ratio.

Figure 4B:
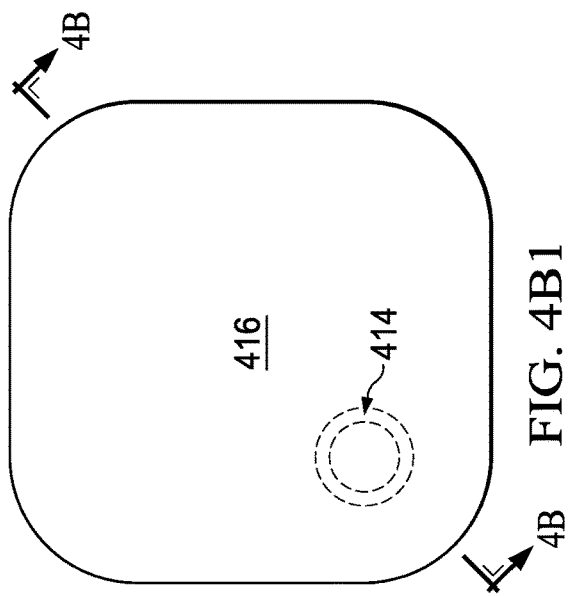
Figure 4B:
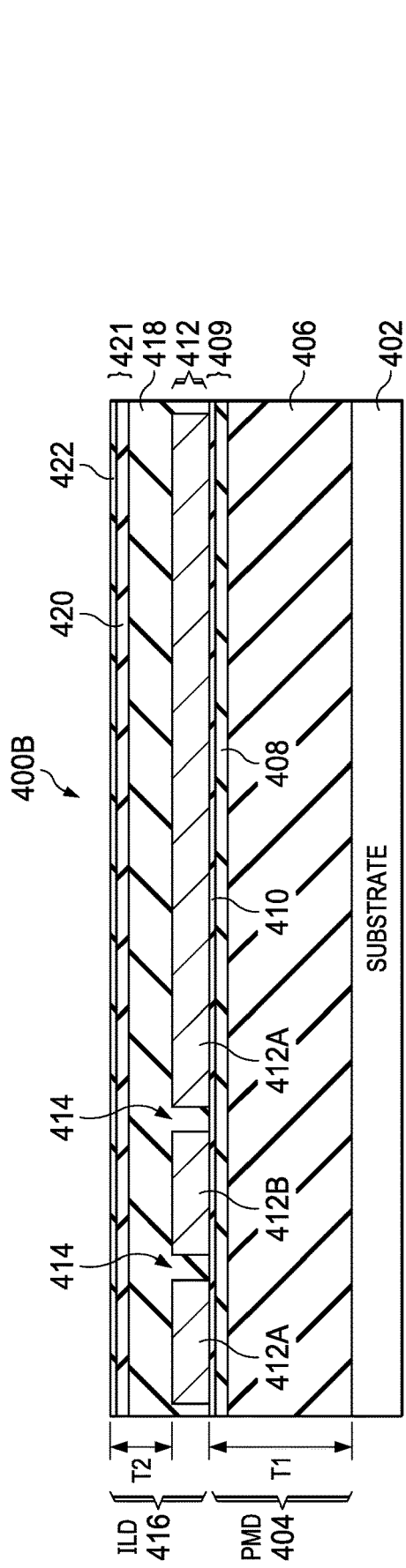
Figure 4C:
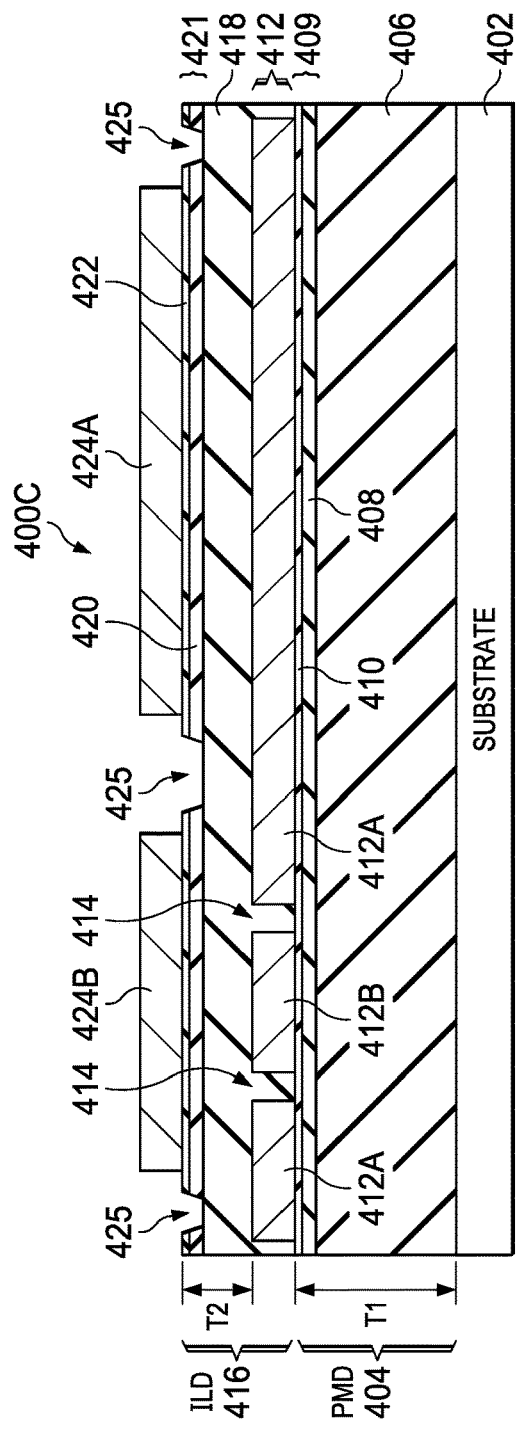
Figure 4C:
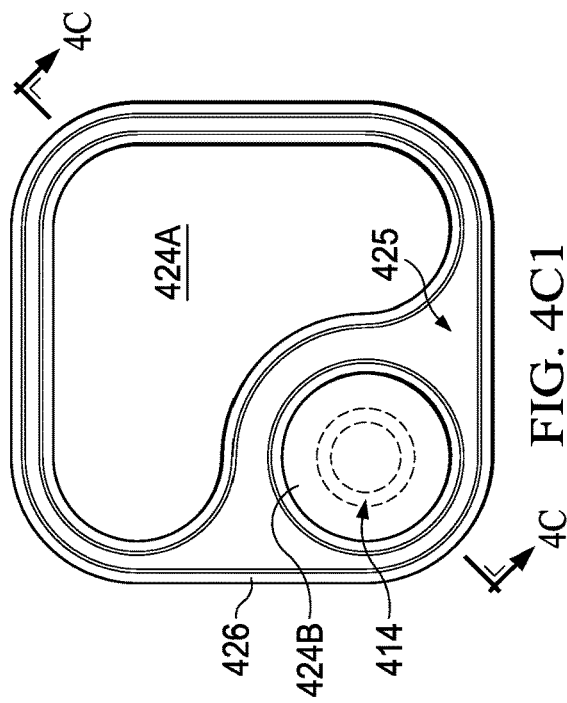
Figure 4D:
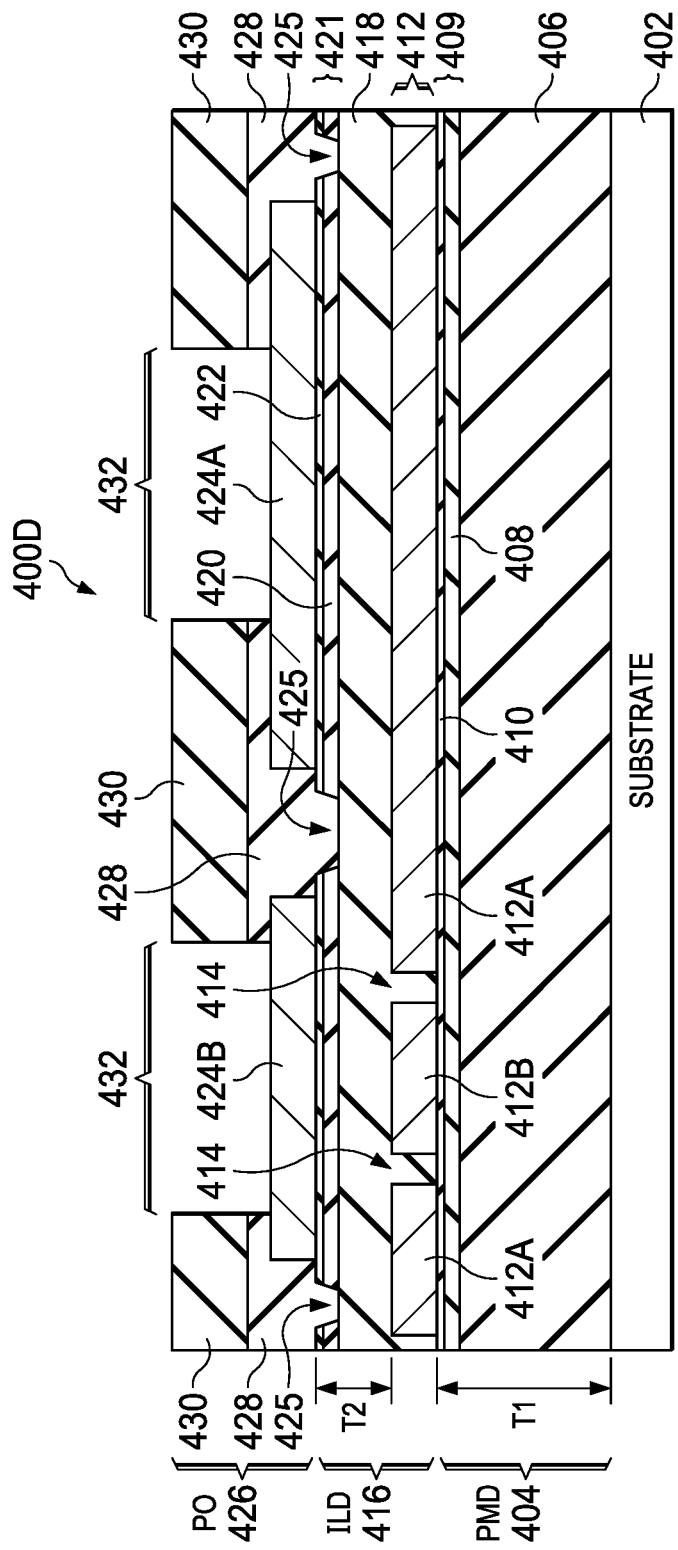
Figure 4E:
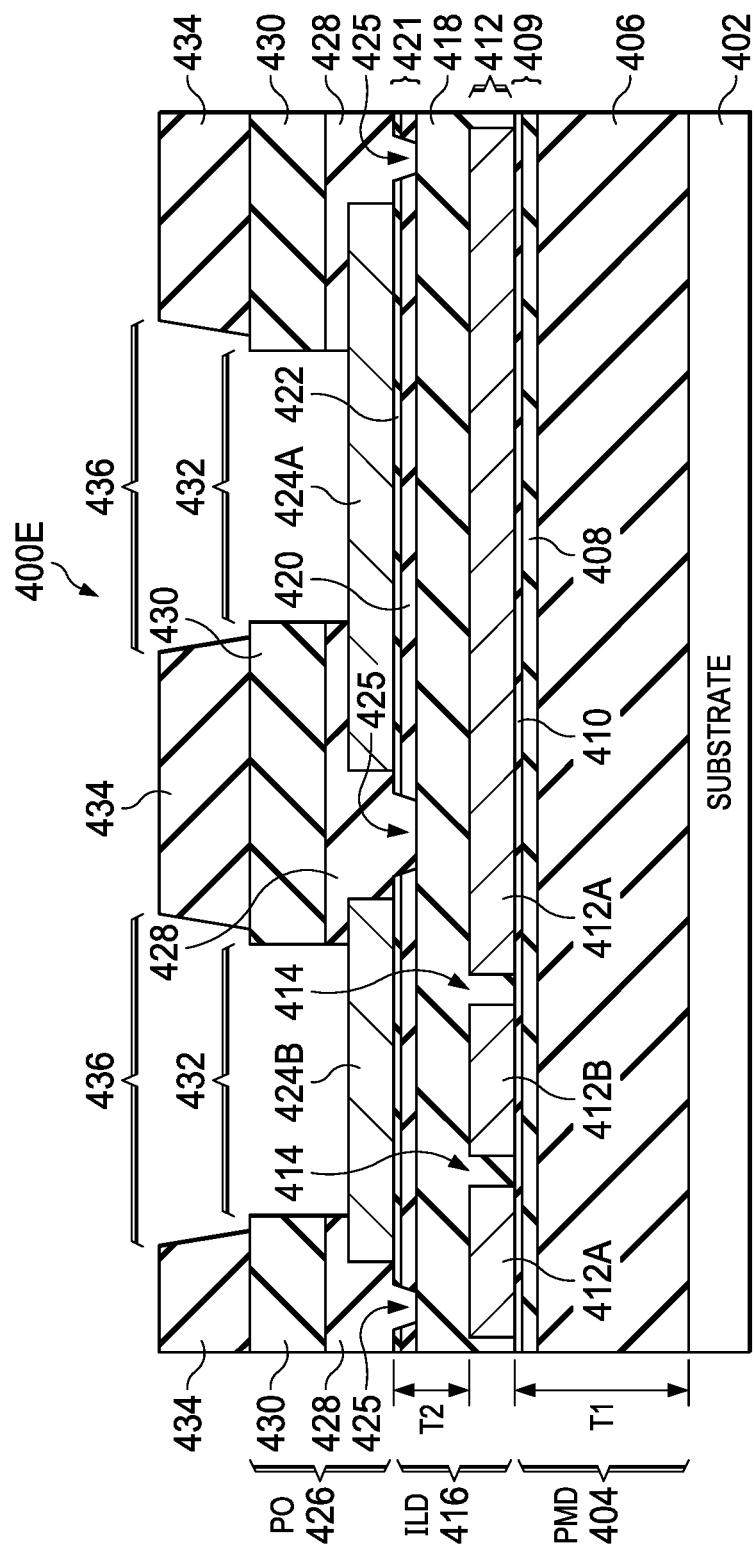

FIGS. 4A through 4E depict a cross-section of a galvanic isolation capacitor device 400 at various stages of processing, while FIGS. 4A1 through 4E1 depict corresponding top-down views of the galvanic isolation capacitor device 400. In each case, the FIG. 4X1, where X is equal to any of A, B, C, D, E, is a plan view that indicates the cut-line through which the cross-section of the corresponding FIG. 4X is taken.

In FIG. 4A, galvanic isolation capacitor device 400A includes a PMD layer 404 that has been formed on a semiconductor substrate 402 and that has a first thickness T1. In one implementation, the semiconductor substrate 402 is silicon, although other substrates can also be utilized. In one implementation, PMD layer 404 includes a first oxide layer 406 formed on the substrate 402 and a first nitrogen-containing dielectric layer 409 formed on the first oxide layer 406. In one implementation, the first oxide layer 406 is a thick silicon dioxide layer and the first nitrogen-containing dielectric layer 409 includes a first silicon oxynitride layer 408 on the first oxide layer 406 and a first silicon nitride layer 410 on the first silicon oxynitride layer 408. A first metal layer 412 has been formed in contact with PMD layer 404 and provides a lower metal plate 412A. A capacitance-reducing opening 414 has been formed in the location of the smaller second capacitor. In the present implementation, the capacitance-reducing opening 414 is a trench that isolates a region 412B from the lower metal plate 412A. As was shown in FIG. 3B, the capacitance-reducing opening 414 can also be an opening having a circular or other shape in which all of the metal is removed within the area currently shown as the region 412B. In FIG. 4A1, capacitance-reducing opening 414 is a circular trench 414 within the lower metal plate 412A.

In galvanic isolation capacitor device 400B, an ILD layer 416 has been formed on the lower metal plate 412A; the ILD layer 416 has a second thickness T2. In one implementation, the ratio of the first thickness T1 to the second thickness T2 is between about 1 and about 1.55. In one implementation, ILD layer 416 includes a second oxide layer 418 formed on the lower metal plate 412A and a second nitrogen-containing dielectric layer 421 formed on the second oxide layer 418. In one implementation, the second oxide layer 418 is a thick silicon dioxide layer and the second nitrogen-containing dielectric layer is a second silicon oxynitride layer 420 on the second oxide layer 418, and a second silicon nitride layer 422 on the second silicon oxynitride layer 420. In FIG. 4B1, the only visible feature is the surface of ILD layer 416; the capacitance-reducing region 414 is shown in dotted lines. FIG. 4B depicts ILD layer 416 as planarized over the capacitance-reducing opening 414 but in some embodiments ILD layer 416 would not be planarized, and some topography could exist in the dielectric stack above capacitance-reducing openings 414. As the thickness of ILD layer 416 increases, this topography would be reduced.

FIG. 4C depicts the galvanic isolation capacitor device 400C after a second metal layer 424 has been patterned to form a first upper metal plate 424A and a second upper metal plate 424B in contact with the ILD layer 416. In the implementation shown, the first metal layer 412 that is used to form the lower metal plate 412A and the second metal layer 424 that is used to form the first upper metal plate 424A and the second upper metal plate 424B are formed of aluminum using subtractive etching. In other implementations, the metal layers 412, 424 can be formed of copper using damascene process. After formation of the first upper metal plate 424A and the second upper metal plate 424B, an isolation trench 425 has been formed through the second nitrogen-containing dielectric layer 421. The isolation trench 425 surrounds each of the first upper metal plate 424A and the second upper metal plate 424B. FIG. 4C1 depicts the first upper metal plate 424A and the second upper metal plate 424B in contact with the ILD layer 416; the capacitance-reducing opening 414 is again shown by dotted lines. Upper metal plate 424B could have some topography if ILD layer 416 is not planarized over capacitance-reducing trenches 414.

FIG. 4D depicts the galvanic isolation capacitor device 400D after formation of a protective overcoat layer 426 that in one implementation includes a silicon dioxide layer 428 and a silicon oxynitride layer 430. A first contact opening 432A and a second contact opening 432B have been formed to contact the first upper metal plate 424A and the second upper metal plate 424B. FIG. 4D1 depicts the protective overcoat layer 426, as well as the first contact opening 432A and the second contact opening 432B that expose first upper metal plate 424A and second upper metal plate 424B respectively. Protective overcoat layer 426 is depicted as planarized over the topography on the device but in some embodiments layer 426 would not be planarized.

FIG. 4E depicts the galvanic isolation capacitor device 400E after formation of a polyimide layer 434 on protective overcoat layer 426. Access openings 436 have been formed to expose the contact openings 432 that are used to contact the capacitors. In FIG. 4E1, first upper metal plate 424A and second upper metal plate 424B are each exposed by the contact openings 432 and access openings 436 through polyimide layer 434.

FIG. 5 provides a flowchart that depicts a process 500 of forming an integrated circuit chip according to an implementation of the application, specifically a process of forming an integrated circuit chip that forms a galvanic isolation capacitor device. Process 500 begins with forming 505 a PMD layer on a semiconductor substrate. The PMD layer has a first thickness. A lower metal plate is formed 510 over the PMD layer. An ILD layer is then formed 515 on the lower metal plate. The ILD layer has a second thickness such that a ratio of the first thickness to the second thickness is between about 1.0 and about 1.55. Then a first upper metal plate and a second upper metal plate are formed 520 over the ILD layer. The first upper metal plate has a first area and the second upper metal plate has a second area; a ratio of the first area to the second area is greater than about 5.0. In one implementation, the ratio of the first area to the second area is less than about 10. In one implementation, the ratio of the first area to the second area is about 6.5.

FIG. 5A through FIG. 5I each provide either further details for elements of process 500 or additional elements for the process 500. In FIG. 5A, the process of forming the PMD layer is further defined for one implementation in which a first oxide layer is formed 525 over the semiconductor substrate and a first nitrogen-containing dielectric layer is formed 530 on the first oxide layer. In one implementation, the first nitrogen-containing dielectric layer can include a first silicon oxynitride layer and a first silicon nitride layer. In FIG. 5B, the process of forming the ILD layer is further defined for one implementation in which a second oxide layer is formed 535 over the lower metal plate and a second nitrogen-containing dielectric layer is formed 540 on the second oxide layer, where the second nitrogen-containing dielectric layer includes a second silicon oxynitride layer and a second silicon nitride layer.

After the process 500 is performed, FIG. 5C provides an additional element of forming 545 an isolation trench through the second nitrogen-containing dielectric layer, the isolation trench surrounding the first upper metal plate and the second upper metal plate. FIG. 5D provides further additional elements of forming 550 a dielectric overcoat layer on the first upper metal plate, the second upper metal plate, and a portion of the ILD layer and forming 555 a first contact opening and a second contact opening through the dielectric overcoat layer. The first contact opening is over the first upper metal plate and the second contact opening is over the second upper metal plate. In one implementation, the protective overcoat layer contains a silicon dioxide layer and a silicon oxynitride layer. Further additional elements are shown in FIG. 5E as forming 560 a polyimide layer on the dielectric overcoat layer and forming 565 a first access opening and a second access opening through the polyimide layer. The first access opening is over the first contact opening and the second access opening is over the second contact opening.

In FIG. 5F, as part of forming 510 the lower metal plate in one implementation, a capacitance-reducing opening is formed 570 through the lower metal plate, with the capacitance-reducing opening being located under the second upper metal plate. In one implementation shown in FIG. 5G, the element of forming 570 the capacitance-reducing opening includes forming 575 a circular trench that isolates a portion of the lower metal plate from a remainder of the lower metal plate. In one implementation shown in FIG. 5H, the element of forming 570 the capacitance-reducing opening includes forming 580 a circular opening through the lower metal plate.

In the implementation previously discussed with regard to FIG. 4A through FIG. 4E and shown in FIG. 5I, the element of forming 510 the lower metal plate includes patterning 585 a first aluminum layer using subtractive etching and the element of forming 520 the first upper metal plate and the second upper metal plate includes patterning 590 a second aluminum layer using subtractive etching. In other implementations, which are not specifically shown, forming the lower metal plate includes forming a first copper layer using damascene processing and forming the first upper metal plate and the second upper metal plate includes forming a second copper layer using damascene processing.

Applicants have disclosed a standalone galvanic isolation capacitor device, a multi-chip module that contains the standalone galvanic isolation capacitor device, and a process of fabricating an integrated circuit that contains the standalone galvanic isolation capacitor device. In disclosed implementations, the first capacitor has an area that is between about 5 times and about 10 times the area of the second capacitor. The thickness of the PMD layer for the standalone galvanic isolation capacitor device is between about 1 and 1.55 times the thickness of the ILD layer. In some embodiments to reduce both total die area and total capacitance, the effective size of the second capacitor can be decreased by etching a capacitance-reducing opening through the lower metal plate under the second upper metal plate.

Advantages of the disclosed standalone galvanic isolation capacitor device may include one or more of the following:
  The fabrication process is low cost and simple, with only five pattern levels for metal-1, metal-2, the isolation trench, the contact openings through the protective overcoat layer, and the access openings through the polyimide layer;
  The ability to tune the die size and total series capacitance by a simple layout change;
  The metal-1 layer is used only to capacitively couple to the metal-2 upper plates, so a deep via is unnecessary; and
  Can be integrated in an MCM to provide isolation on devices with many different functions.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A galvanic isolation capacitor device comprising:
  a pre-metal dielectric (PMD) layer over a semiconductor substrate, the PMD layer having a first thickness;
  a lower metal plate located over the PMD layer and having a first portion and a second portion contiguous with the first portion;
  an inter-level dielectric (ILD) layer located over the lower metal plate, the ILD layer having a second thickness, a ratio of the first thickness to the second thickness being between about 1 and about 1.55 inclusive;
  a first upper metal plate located over the ILD layer and the first portion of the lower metal plate, the first upper metal plate having a first area; and
  a second upper metal plate non-contiguous with the first upper metal plate and located over the ILD layer and the second portion of the lower metal plate, the second upper metal plate having a second area, a ratio of the first area to the second area being greater than about 5 and less than about 10.

2. The galvanic isolation capacitor device as recited in claim 1 in which the PMD layer includes:
  a first oxide layer over the semiconductor substrate; and
  a first nitrogen-containing dielectric layer over the first oxide layer and in contact with the lower metal plate.

3. The galvanic isolation capacitor device as recited in claim 2 in which the ILD layer includes:
  a second oxide layer over the lower metal plate; and
  a second nitrogen-containing dielectric layer over the second oxide layer and in contact with the first upper metal plate and the second upper metal plate.

4. The galvanic isolation capacitor device as recited in claim 1 in which the lower metal plate includes a capacitance-reducing opening, the capacitance-reducing opening in a location under the second upper metal plate.

5. The galvanic isolation capacitor device as recited in claim 4 in which the capacitance-reducing opening is a trench that isolates a portion of the lower metal plate from a remainder of the lower metal plate.

6. The galvanic isolation capacitor device as recited in claim 4 in which the capacitance-reducing opening is a circular opening through the lower metal plate.

7. The galvanic isolation capacitor device as recited in claim 1 in which the lower metal plate, the first upper metal plate, and the second upper metal plate comprise aluminum.

8. The galvanic isolation capacitor device as recited in claim 1, wherein the PMD layer, the ILD layer, the lower metal plate and the first and second upper metal plates are parallel to a planar top surface of the semiconductor substrate.

9. A process of forming an integrated circuit chip comprising:
  forming a pre-metal dielectric (PMD) layer on a semiconductor substrate, the PMD layer having a first thickness;
  forming a lower metal plate over the PMD layer, the lower metal plate having a first portion and a contiguous second portion;
  forming an inter-level dielectric (ILD) layer on the lower metal plate, the ILD layer having a second thickness, a ratio of the first thickness to the second thickness being between about 1.0 and about 1.55; and
  forming a first upper metal plate and a second upper metal plate over the ILD layer, the first upper metal plate being non-contiguous with the second upper metal plate and having a first area, the second upper metal plate having a second area, and a ratio of the first area to the second area being greater than 5.0.

10. The process as recited in claim 9 in which forming the PMD layer includes:

forming a first oxide layer over the semiconductor substrate; and forming a first nitrogen-containing dielectric layer on the first oxide layer.

11. The process as recited in claim 10 in which forming the ILD layer includes:

forming a second oxide layer over the lower metal plate; and forming a second nitrogen-containing dielectric layer on the second oxide layer.

12. The process as recited in claim 11 including forming an isolation trench through the second nitrogen-containing dielectric layer, the isolation trench surrounding the first upper metal plate and the second upper metal plate.

13. The process as recited in claim 12 including:

forming a dielectric overcoat layer on the first upper metal plate, the second upper metal plate, and a portion of the ILD layer; and forming a first contact opening and a second contact opening through the dielectric overcoat layer, the first contact opening being over the first upper metal plate and the second contact opening being over the second upper metal plate.

14. The process as recited in claim 13 including:

forming a polyimide layer on the dielectric overcoat layer; and forming a first access opening and a second access opening through the polyimide layer, the first access opening being over the first contact opening and the second access opening being over the second contact opening.

15. The process as recited in claim 9 in which forming the lower metal plate includes forming a capacitance-reducing opening through the lower metal plate, the capacitance-reducing opening located under the second upper metal plate.

16. The process as recited in claim 15 in which forming the capacitance-reducing opening includes forming a circular trench that isolates a portion of the lower metal plate from a remainder of the lower metal plate.

17. The process as recited in claim 15 in which forming the capacitance-reducing opening includes forming a circular opening through the lower metal plate.

18. The process as recited in claim 9 in which:

forming the lower metal plate includes patterning a first aluminum layer using subtractive etching; and forming the first upper metal plate and the second upper metal plate includes patterning a second aluminum layer using subtractive etching.

19. The process as recited in claim 9, wherein the PMD layer, the ILD layer, the lower metal plate and the first and second upper metal plates are parallel to a planar top surface of the semiconductor substrate.

20. A capacitive device, comprising:

a lower metal plate located over a semiconductor substrate and having a first portion and a second portion contiguous with the first portion;

a dielectric layer located over the lower metal plate;

a first upper metal plate located over the dielectric layer and the first portion of the lower metal plate;

a second upper metal plate non-contiguous with the first upper metal plate and located over the dielectric layer and the second portion of the lower metal plate, the second portion of the lower metal plate having a first perimeter defined by a projection of the second upper metal plate onto the lower metal plate; and a metal-free area at a same level of the lower metal plate surrounded by the first perimeter and having a second perimeter smaller than the first perimeter.

21. The capacitive device as recited in claim 20, wherein the lower metal plate, the first and second upper metal plates and the dielectric layer are parallel to a planar top surface of the semiconductor substrate.

22. The capacitive device as recited in claim 20, wherein the first perimeter and the second perimeter are circular.

23. The capacitive device as recited in claim 20, wherein the metal-free area extends from a center of the first perimeter to the second perimeter.

24. The capacitive device as recited in claim 20, wherein the first upper metal plate has a first area, the second upper metal plate having a second area, and a ratio of the first area to the second area is greater than 5.0.

* * * * *